US012356571B2

(12) United States Patent
Kim

(10) Patent No.: US 12,356,571 B2
(45) Date of Patent: Jul. 8, 2025

(54) ELECTRONIC DEVICE INCLUDING COVER

(71) Applicant: SAMSUNG ELECTRONICS CO., LTD., Suwon-si (KR)

(72) Inventor: Hyungin Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 270 days.

(21) Appl. No.: 17/860,854

(22) Filed: Jul. 8, 2022

(65) Prior Publication Data

US 2023/0018597 A1 Jan. 19, 2023

Related U.S. Application Data

(63) Continuation of application No. PCT/KR2022/008997, filed on Jun. 24, 2022.

(30) Foreign Application Priority Data

Jul. 14, 2021 (KR) .................. 10-2021-0092323

(51) Int. Cl.
*H05K 5/03* (2006.01)
*H05K 5/00* (2025.01)

(52) U.S. Cl.
CPC .............. *H05K 5/03* (2013.01); *H05K 5/0018* (2022.08)

(58) Field of Classification Search
CPC .......... H05K 5/03; H05K 5/0018; H05K 5/00; H05K 5/0017; H04M 1/0214; H04M 1/02;

(Continued)

(56) References Cited

U.S. PATENT DOCUMENTS 10,126,561 B2 11/2018 Kakinuma et al.
10,416,363 B2 9/2019 Yasuda et al.
(Continued)

FOREIGN PATENT DOCUMENTS

CN 112055104 A 12/2020
JP 2017107107 A 6/2017
(Continued)

OTHER PUBLICATIONS

International Search Report with Written Opinion issued in International Application No. PCT/KR2022/008997; International Filing Date Jun. 24, 2022; Date of Mailing Oct. 21, 2022 (8 pages).

(Continued)

*Primary Examiner* — Abhishek M Rathod
*Assistant Examiner* — Keon Kim
(74) *Attorney, Agent, or Firm* — CANTOR COLBURN LLP

(57) ABSTRACT

Disclosed is an electronic device. The electronic device includes a cover having a front surface defining one surface of the electronic device and a rear surface that is an opposite surface to the front surface, the front surface of the cover includes an upper surface, a lower surface, and an inclined surface extending from a periphery of the upper surface to a periphery of the lower surface toward the rear surface, the cover includes at least one protrusion at least partially formed at the periphery of the upper surface by partially recessing the upper surface in a direction that faces the rear surface, the inclined surface includes a first inclined surface extending substantially flat from the at least one protrusion to a first section of the periphery of the lower surface. Other various embodiments recognized through the specification are possible.

16 Claims, 11 Drawing Sheets

(58) Field of Classification Search
CPC ............. H04M 1/0268; H04M 1/0216; H04M 1/0283; H04M 1/0202; G06F 1/1656
See application file for complete search history.

(56) References Cited

U.S. PATENT DOCUMENTS

| | | |
|---|---|---|
| 10,827,635 B1 | 11/2020 | Limarga et al. |
| 10,921,860 B2 | 2/2021 | Fenton et al. |
| 11,109,500 B2 | 8/2021 | Shannon et al. |
| 2016/0016845 A1 | 1/2016 | Cho et al. |
| 2016/0178916 A1 | 6/2016 | Kakinuma et al. |
| 2019/0155339 A1 | 5/2019 | Fenton et al. |
| 2020/0039001 A1 | 2/2020 | Nashner et al. |
| 2020/0377409 A1* | 12/2020 | Jin ..................... C03C 21/002 |
| 2021/0080622 A1 | 3/2021 | Kim et al. |
| 2021/0107045 A1* | 4/2021 | Yang ....................... C03C 17/32 |
| 2021/0165461 A1 | 6/2021 | Fenton et al. |
| 2021/0170785 A1* | 6/2021 | Kim ..................... A45D 33/006 |
| 2021/0303031 A1* | 9/2021 | Poole ..................... G06F 1/1656 |
| 2022/0167517 A1 | 5/2022 | Moon et al. |
| 2022/0322557 A1 | 10/2022 | Limarga et al. |
| 2023/0124179 A1 | 4/2023 | Shannon et al. |

FOREIGN PATENT DOCUMENTS

| | | |
|---|---|---|
| KR | 101336934 B1 | 12/2013 |
| KR | 20140100775 A | 8/2014 |
| KR | 101787570 B1 | 11/2017 |
| KR | 20190072441 A | 6/2019 |
| KR | 20200112228 A | 10/2020 |

OTHER PUBLICATIONS

Korean Office Action corresponding to Application No. KR 10-2021-0092323; Dated Apr. 10, 2025.

* cited by examiner

ELECTRONIC DEVICE INCLUDING COVER

CROSS-REFERENCE TO RELATED APPLICATION(S)

This application is a continuation application, claiming priority under § 365(c), of an International Application No. PCT/KR2022/008997, filed on Jun. 24, 2022, which is based on and claims the benefit of a Korean patent application number 10-2021-0092323, filed on Jul. 14, 2021, in the Korean Intellectual Property Office, the disclosure of which is incorporated by reference herein in its entirety.

Embodiments disclosed in the disclosure relate to an electronic device including a cover.

BACKGROUND ART

An electronic device may include a cover forming an external appearance of the electronic device. Layers for providing a visual effect to a user may be laminated on the cover. For example, a printing film having various colors and patterns may be laminated on a rear surface of the cover. However, the scheme has a restriction in designs that are intended to be implemented due to a limitation in a form factor and a material of the electronic device. Technologies for treating a surface of a cover have been developed to overcome the restrictions and provide a new design worth to consumers. For example, a pattern including an embossed part and an engraved part may be applied to a surface of the cover. The cover having this pattern may be provided a unique grip and a unique texture to a user.

DISCLOSURE

Technical Problem

The pattern of the cover including the embossed part and the engraved part may be formed by applying the cover to a mold having a corresponding shape and applying heat and pressure. During this forming process, a polishing process may be performed to eliminate a surface defect due to the applied heat and pressure. A corner portion of the embossed part may be overly polished due to an edge effect during the polishing process, and a border between the embossed part and the engraved part may appear torn down due to an over-polishing phenomenon. That is, because a sharpness of the pattern becomes lower, a border between the embossed part and the engraved part may not be distinguished clearly, and thus it is difficult to implement an intended design.

The disclosure may provide a cover having an enhanced pattern sharpness and an electronic device including the cover.

Technical Solution

An electronic device according to an aspect of the disclosure includes a cover having a front surface defining one surface of the electronic device and a rear surface that is an opposite surface to the front surface, the front surface of the cover includes an upper surface, a lower surface, and an inclined surface extending from a periphery of the upper surface to a periphery of the lower surface toward the rear surface, the cover includes at least one protrusion at least partially formed at the periphery of the upper surface by partially recessing the upper surface in a direction that faces the rear surface, the inclined surface includes a first inclined surface extending substantially flat from the at least one protrusion to a first section of the periphery of the lower surface.

An electronic device according to another aspect of the disclosure includes a cover having a front surface defining one surface of the electronic device and a rear surface that is an opposite surface to the front surface, wherein the front surface of the cover includes an upper surface, a lower surface, and an inclined surface extending from a periphery of the upper surface to a periphery of the lower surface toward the rear surface, the cover includes at least one recess at least partially formed at the periphery of the lower surface by partially recessing the lower surface in a direction that faces the rear surface, the inclined surface includes a first inclined surface extending substantially flat from the at least one recess to a first section of the periphery of the upper surface.

Advantageous Effects

According to the disclosure, the sharpness of the pattern formed in the cover may be enhanced.

According to the disclosure, the cover having an enhanced sharpness of the pattern through the protrusion formed in the embossed part may be provided.

According to the disclosure, an intended design may be easily implemented by enhancing the sharpness of the pattern of the cover through the protrusion formed in the embossed part.

In addition, the disclosure may provide various effects that are directly or indirectly recognized.

DESCRIPTION OF DRAWINGS

With regard to descriptions of drawings, the same or similar components may be marked by the same or similar reference numerals.

DETAILED DESCRIPTION

Hereinafter, various embodiments of the disclosure will be described with reference to the accompanying drawings.

Accordingly, those of ordinary skill in the art will recognize that modifications, equivalents, and/or alternatives of the various embodiments described herein can be variously made without departing from the scope and spirit of the disclosure.

Figure 1:
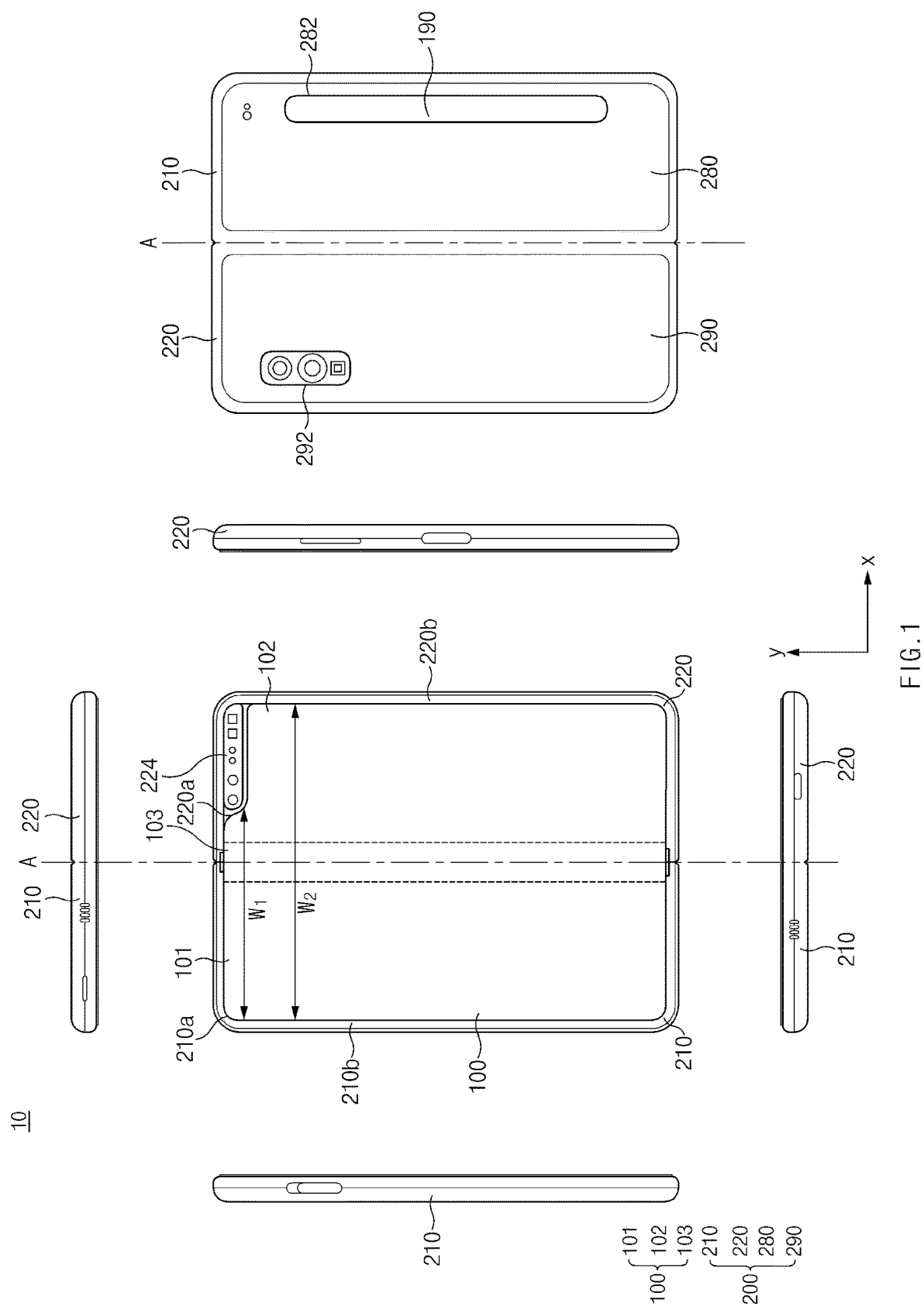
FIG. 1 illustrates a flat state of an electronic device according to an embodiment.

FIG. 1 illustrates a flat state of an electronic device according to an embodiment.

Figure 2:
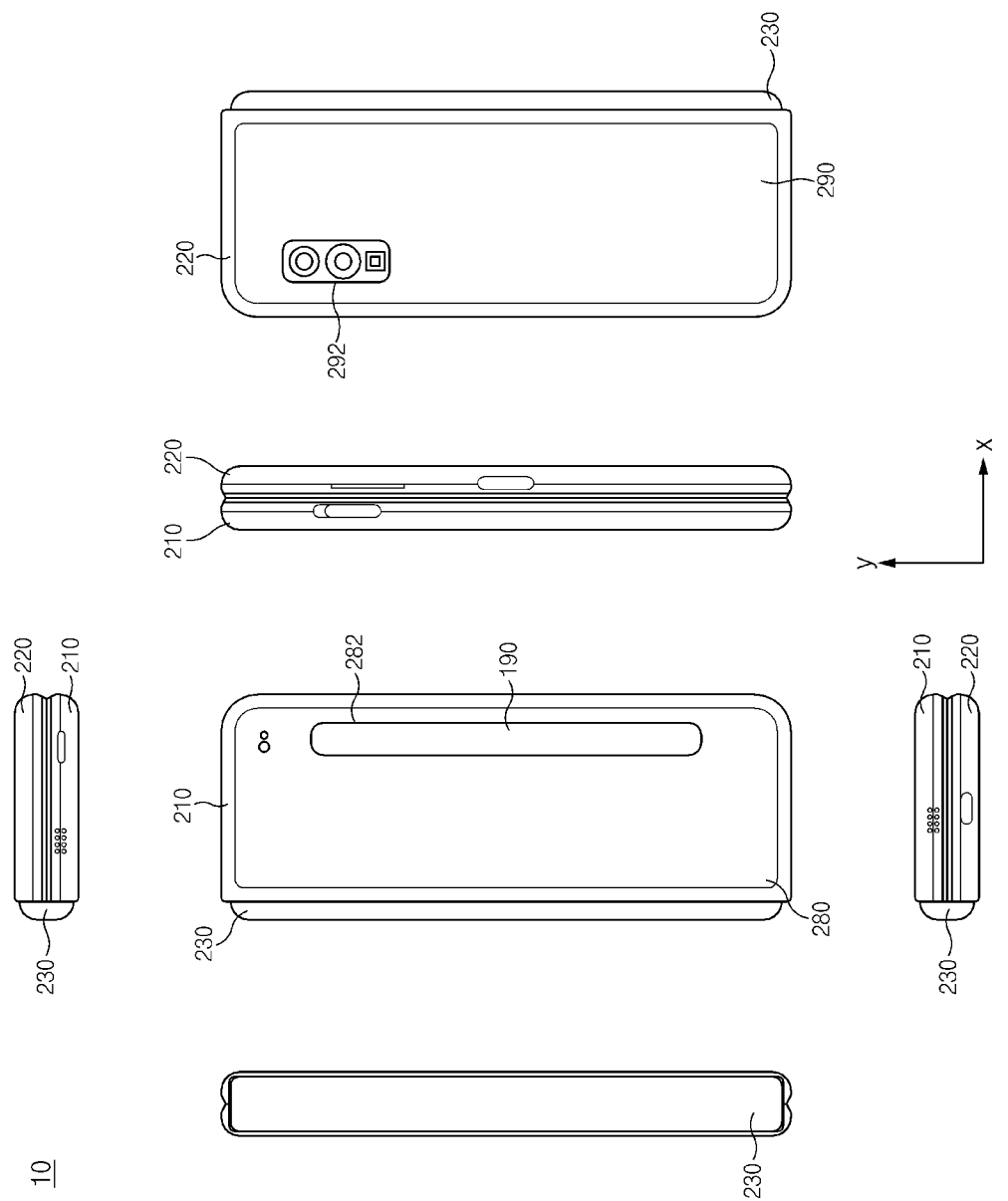
FIG. 2 illustrates a folded state of an electronic device according to an embodiment.

FIG. 2 illustrates a folded state of an electronic device according to an embodiment.

Referring to FIGS. 1 and 2, an electronic device 10 may include a foldable housing 200, a hinge cover 230 that covers a foldable portion of the foldable housing 200, and a flexible or foldable display 100 (hereinafter, briefly referred to as 'a display 100') disposed in a space formed in the foldable housing 200.

In the disclosure, a surface on which the display 100 is disposed is defined as a first surface or a front surface of the electronic device 10. An opposite surface of the front surface is defined as a second surface or a rear surface of the electronic device 10. A surface that surrounds a space between the front surface and the rear surface is defined as a third surface or a side surface of the electronic device 10.

According to an embodiment, the foldable housing 200 may include a first housing structure 210, a second housing structure 220 including a sensor area 224, a first rear cover 280, and a second rear cover 290. The foldable housing 200 of the electronic device 10 is not limited to the shape and coupling state illustrated in FIGS. 1 and 2, and may be realized through another shape or another combination and/or coupling of components. For example, in another embodiment, the first housing structure 210 and the first rear cover 280 may be integrally formed, and the second housing structure 220 and the second rear cover 290 may be integrally formed.

In the illustrated embodiment, the first housing structure 210 and the second housing structure 220 may be disposed on opposite sides of a folding axis (axis "A"), and may be symmetrical with respect to the folding axis "A". As will be described below, an angle or a distance between the first housing structure 210 and the second housing structure 220 may be changed according to whether a state of the electronic device 10 is a flat state, a folded state, or an intermediate state. In the illustrated embodiment, unlike the first housing structure 210, the second housing structure 220 may additionally include the sensor area 224, in which various sensors are disposed, but may have a mutually symmetrical shape in the other areas. In another embodiment, the sensor area 224 may be additionally disposed in at least a partial area of the second housing structure 220 or may be replaced.

Figure 3:
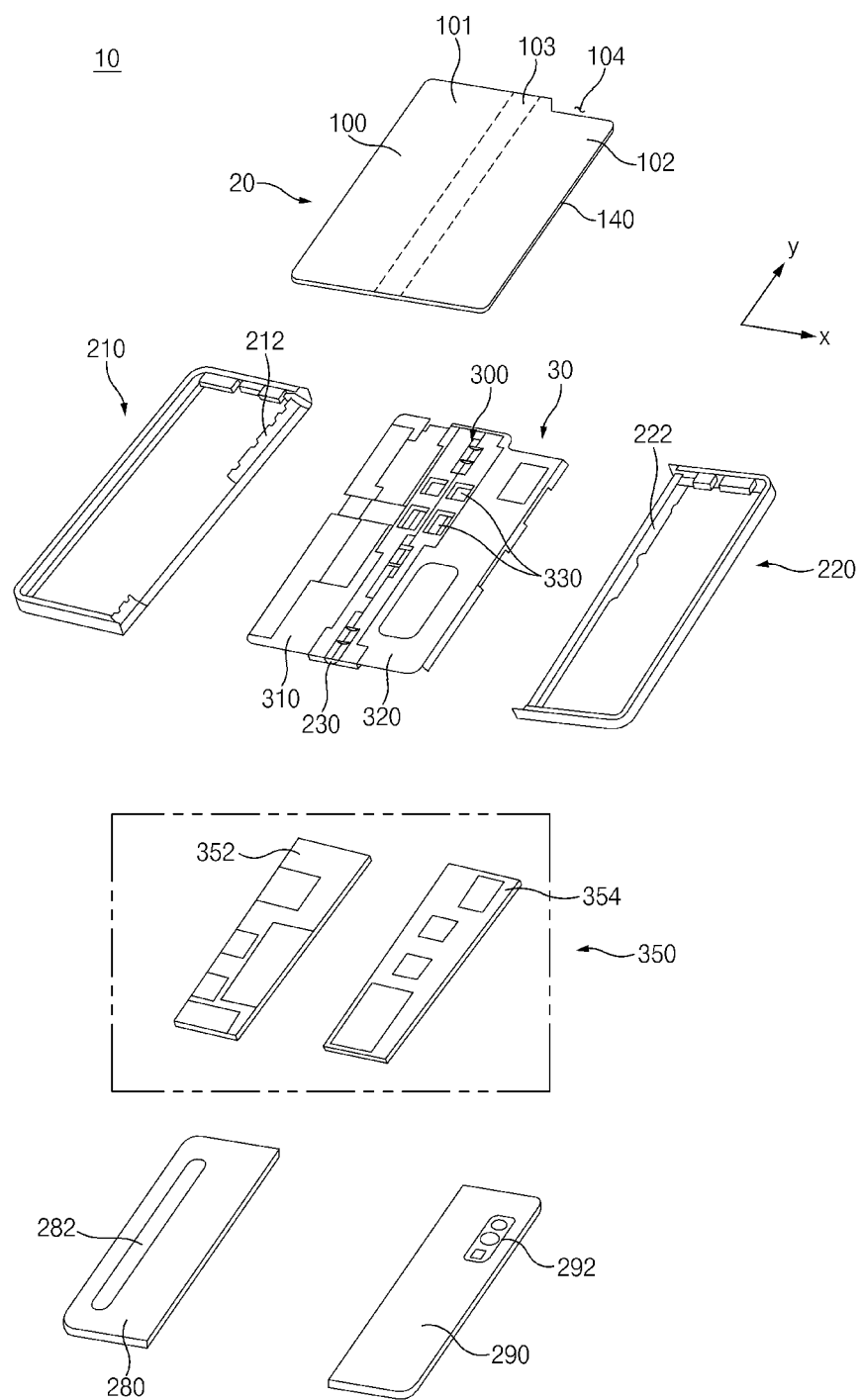
FIG. 3 is an exploded perspective view of an electronic device according to an embodiment.

In an embodiment, the electronic device 10 may be operated in an in-folding scheme or an out-folding scheme as the first housing structure 210 is rotated in a range of about 0 degrees to about 360 degrees, inclusive, with respect to the second housing structure 220 through a hinge structure (e.g., a hinge structure 300 of FIG. 3). According to various embodiments, the hinge structure 300 may be formed in a longitudinal direction or in a transverse direction when the electronic device 10 is viewed from a top perspective. According to various embodiments, a plurality of hinge structures 300 may be provided. For example, all of the plurality of hinge structures 300 may be arranged in the same direction. In another example, some of the plurality of hinge structures 300 may be arranged in different directions to be folded.

In an embodiment, as illustrated in FIG. 1, the first housing structure 210 and the second housing structure 220 may have recesses that accommodate the display 100 together. In the illustrated embodiment, due to the sensor area 224, the recesses may have two different widths in a direction that is perpendicular to the folding axis "A".

According to an embodiment, the recesses may have a first width $W_1$ between a first portion 210a of the first housing structure 210, which is parallel to the folding axis "A", and a first portion 220a of the second housing structure 220, which is defined at a periphery of the sensor area 224. Furthermore, the recesses may have a second width $W_2$ defined by a second portion 210b of the first housing structure 210, and a second portion 220b of the second housing structure 220, which does not correspond to the sensor area 224 and is parallel to the folding axis "A". In this case, the second width $W_2$ may be longer than the first width $W_1$. In other words, the first portion 210a of the first housing structure 210 and the first portion 220a of the second housing structure 220, which have asymmetrical shapes, may define the first width $W_1$ of the recesses, and the second portion 210b of the first housing structure 210 and the second portion 220b of the second housing structure 220, which have symmetrical shapes, may define the second width $W_2$ of the recesses. According to an embodiment, the distances of the first portion 220a and the second portion 220b of the second housing structure 220 from the folding axis "A" may be different. The widths of the recesses are not limited to the illustrated examples. In various embodiments, the recesses may have a plurality of widths due to the form of the sensor area 224 or the portions of the first housing structure 210 and the second housing structure 220, which have asymmetrical shapes.

In an embodiment, at least a portion of the first housing structure 210 and the second housing structure 220 may be formed of a metallic material or a nonmetallic material having a selected strength to support the display 100.

In an embodiment, the sensor area 224 may be formed to have a predetermined area at a location that is adjacent to one corner of the second housing structure 220. However, the arrangement, shape, or size of the sensor area 224 is not limited to the illustrated example. For example, in another embodiment, the sensor area 224 may be provided in another corner of the second housing structure 220 or a predetermined area between an upper end corner and a lower end corner of the second housing structure 220. In an embodiment, components for performing various functions embedded in the electronic device 10 may be exposed to the front surface of the electronic device 10 through the sensor area 224 or through one or more openings provided in the sensor area 224. In various embodiments, the components may include various kinds of sensors. The sensors, for example, may include at least one of a front camera, a receiver, a proximity sensor, an illumination sensor, an iris recognition sensor, an ultrasonic wave sensor, or an indicator.

The first rear cover 280 may be disposed on a rear surface of the electronic device on one side of the folding axis and, for example, may have a substantially rectangular periphery. The periphery of the first rear cover 280 may be surrounded by the first housing structure 210. Similarly, the second rear cover 290 may be disposed on the rear surface of the electronic device on another side of the folding axis. A periphery of the second rear cover 290 may be surrounded by the second housing structure 220.

In the illustrated embodiment, the first rear cover 280 and the second rear cover 290 may have shapes that are substantially symmetrical to each other with respect to the folding axis (axis "A"). However, the first rear cover 280 and the second rear cover 290 do not necessarily have mutually symmetrical shapes. In another embodiment, the first rear cover 280 and the second rear cover 290 may have various shapes. In another embodiment, the first rear cover 280 may be integrally formed with the first housing structure 210, and the second rear cover 290 may be integrally formed with the second housing structure 220.

In an embodiment, the first rear cover 280, the second rear cover 290, the first housing structure 210, and the second housing structure 220 may define spaces in which various components (e.g., a printed circuit board or a battery) of the electronic device 10 may be disposed. In an embodiment, one or more components may be disposed on the rear surface of the electronic device 10 or may be visually exposed. For example, at least a portion of a sub-display 190 may be visually exposed through a first rear area 282 of the first rear cover 280. In another embodiment, one or more components or sensors may be visually exposed through a second rear area 292 of the second rear cover 290. In various embodiments, the sensors may include a proximity sensor and/or a rear camera.

Referring to FIG. 2, the hinge cover 230 is disposed between the first housing structure 210 and the second housing structure 220, and may be configured to cover an internal component (e.g., the hinge structure). In an embodiment, the hinge cover 230 may be covered by a portion of the first housing structure 210 and the second housing structure 220 or be exposed to an exterior according to a state (a flat state or a folded state) of the electronic device 10.

As an example, as illustrated in FIG. 1, when the electronic device 10 is in the flat state, the hinge cover 230 may not be exposed as it is covered by the first housing structure 210 and the second housing structure 220. As an example, as illustrated in FIG. 2, when the electronic device 10 is in a folded state (e.g., a fully folded state), the hinge cover 230 may be exposed between the first housing structure 210 and the second housing structure 220. As an example, when the electronic device 10 is in an intermediate state in which when the first housing structure 210 and the second housing structure 220 define a predetermined angle, the hinge cover 230 may be partially exposed to the exterior between the first housing structure 210 and the second housing structure 220. However, in this case, the exposed area in the intermediate state may be smaller than in a completely folded state. In an embodiment, the hinge cover 230 may include a curved surface.

The display 100 may be disposed in a space defined by the foldable housing 200. For example, the display 100 may be seated on the recess defined by the foldable housing 200, and may constitute most of the front of the electronic device 10.

Accordingly, the front surface of the electronic device 10 may include the display 100, and a partial area of the first housing structure 210 and a partial area of the second housing structure 220, which are adjacent to the display 100. Further, the rear surface of the electronic device 10 may include the first rear cover 280, and a partial area of the first housing structure 210, which is adjacent to the first rear cover 280, and a partial area of the second housing structure 220, which is adjacent to the second rear cover 290.

The display 100 may refer to a display, at least a partial area of which may be deformed to a flat surface or a curved surface. According to an embodiment, the display 100 may include a folding area 103, a first area 101 disposed on one side (e.g., the left side of the folding area 103 illustrated in FIG. 1) of the folding area 103, and a second area 102 disposed on an opposite side (e.g., the right side of the folding area 103 illustrated in FIG. 1).

However, the classification of the areas of the display 100 illustrated in FIG. 1 is illustrative, and the display 100 may be classified into a plurality of areas (e.g., four or more or two) according to the structure or function of the display 100. As an example, although the areas of the display 100 are classified by the folding area 103 or the folding axis (axis "A") extending in parallel to the y axis in the embodiment illustrated in FIG. 1, the areas of the display 100 may be classified with reference to another folding area (e.g., a folding area that is parallel to the x axis) or another folding axis (e.g., a folding axis that is parallel to the x axis) in another embodiment.

The first area 101 and the second area 102 may have shapes that are symmetrical to each other with respect to the folding area 103 as a whole. However, the second area 102, unlike the first area 101, may include a notch that is cut according to a presence of the sensor area 224, but may have a shape that is symmetrical to the first area 101 in other areas. In other words, the first area 101 and the second area 102 may include parts having symmetrical shapes, and parts having asymmetrical shapes.

Hereinafter, the operations of the first housing structure 210 and the second housing structure 220 according to the states (e.g., the flat state and the folded state) of the electronic device 10, and the areas of the display 100 will be described.

In an embodiment, when the electronic device 10 is in a flat state (e.g., FIG. 1), the first housing structure 210 and the second housing structure 220 may be disposed to face the same direction while defining an angle of about 180 degrees therebetween. A surface of the first area 101 and a surface of the second area 102 of the display 100 may form an angle of about 180 degrees therebetween, and may face the same direction (e.g., the forward direction of the electronic device). The folding area 103 may define a same plane as a plane of the first area 101 and a plane of the second area 102.

In an embodiment, when the electronic device 10 is in the folded state (e.g., the state of FIG. 2B), the first housing structure 210 and the second housing structure 220 may be disposed to face each other. The surface of the first area 101 and the surface of the second area 102 of the display 100 may face each other while forming a small angle (e.g., about 0 degrees to about 10 degrees, inclusive) therebetween. At least a portion of the folding area 103 may be a curved surface having a predetermined curvature.

In an embodiment, when the electronic device 10 is in the intermediate state (e.g., the state of FIG. 2B), the first housing structure 210 and the second housing structure 220 may face each other at a certain angle. The surface of first area 101 and the surface of the second area 102 of the display 100 may form an angle that is larger than the angle formed in the folded state and smaller than the angle formed in the flat state. At least a portion of the folding area 103 may be a curved surface having a predetermined curvature, and the curvature then may be smaller than in the folded state.

FIG. 3 is an exploded perspective view of an electronic device according to an embodiment.

Referring to FIG. 3, in an embodiment, the electronic device 10 may include a display unit 20, a bracket assembly 30, a board part 350, the first housing structure 210, the second housing structure 220, the first rear cover 280, and the second rear cover 290. In the disclosure, the display unit 20 may be referred to as a display device, a display module or a display assembly.

The display unit 20, for example, may include the display 100, and one or more plates or layers 140, on which the display 100 is seated. In an embodiment, the plate 140 may be disposed between the display 100 and the bracket assembly 30. The display 100 may be disposed at least at a portion of one surface of the plate 140 (e.g., an upper surface of FIG. 3). The plate 140 may have a shape corresponding to the display 100. For example, a partial area of the plate 140 may have a shape corresponding to a notch area 104 of the display 100.

The bracket assembly 30 may include a first bracket 310, a second bracket 320, the hinge structure 300 disposed between the first bracket 310 and the second bracket 320, the hinge cover 230 that covers the hinge structure 300 when the hinge structure 300 is viewed from the outside, and a wiring member 330 (e.g., a flexible printed circuit board (FPCB)) that crosses the first bracket 310 and the second bracket 320.

In an embodiment, the bracket assembly 30 may be disposed between the plate 140 and the board part 350. As an example, the first bracket 310 may be disposed between the first area 101 of the display 100 and the first board 352. The second bracket 320 may be disposed between the second area 102 of the display 100 and a second board 354.

In an embodiment, at least a portion of the wiring member 330 and the hinge structure 300 may be disposed in the interior of the bracket assembly 30. The wiring member 330 may be disposed in a direction (e.g., the x axis direction) that crosses the first bracket 310 and the second bracket 320. The wiring member 330 may be disposed in a direction (e.g., the x axis direction) that is perpendicular to the folding axis (e.g., the y axis or the folding axis (axis A) of FIG. 1) of the folding area 103 of the electronic device 10.

The board part 350, as mentioned above, may include the first board 352 disposed at the side of the first bracket 310 and the second board 354 disposed at the side of the second bracket 320. The first board 352 and the second board 354 may be arranged in the interior of a space defined by the bracket assembly 30, the first housing structure 210, the second housing structure 220, the first rear cover 280, and the second rear cover 290. Components for realizing various functions of the electronic device 10 may be mounted on the first board 352 and the second board 354.

In an embodiment, the first housing structure 210 and the second housing structure 220 may be assembled to be coupled to opposite sides of the bracket assembly 30 in a state in which the display unit 20 is coupled to the bracket assembly 30. As will be described later, the first housing structure 210 and the second housing structure 220 may be slid on the opposite sides of the bracket assembly 30 and be coupled to the bracket assembly 30.

In an embodiment, the first housing structure 210 may include a first rotation support surface 212, and the second housing structure 220 may include a second rotation support surface 222 corresponding to the first rotation support surface 212. The first rotation support surface 212 and the second rotation support surface 222 may include curved surfaces corresponding to the curved surface included in the hinge cover 230.

In an embodiment, the first rotation support surface 212 and the second rotation support surface 222 may cover the hinge cover 230 such that the hinge cover 230 is not exposed to the rear surface of the electronic device 10 or is exposed minimally when the electronic device 10 is in the flat state (e.g., the state of FIG. 2). Meanwhile, the first rotation support surface 212 and the second rotation support surface 222 may be rotated along a curved surface included in the hinge cover 230 such that the hinge cover 230 is maximally exposed to the rear surface of the electronic device 10 when the electronic device 10 is in the folded state (e.g., the state of FIG. 2).

The electronic device 10 according to various embodiments of the disclosure may include electronic devices, such as a bar type electronic device, a rollable type electronic device, a sliding type electronic device, a wearable type electronic device, a tablet personal computer (PC), and/or a notebook PC (or a laptop). The electronic device 10 according to various embodiments of the disclosure is not limited to the above-described example, and may include other various electronic devices.

Figure 4:
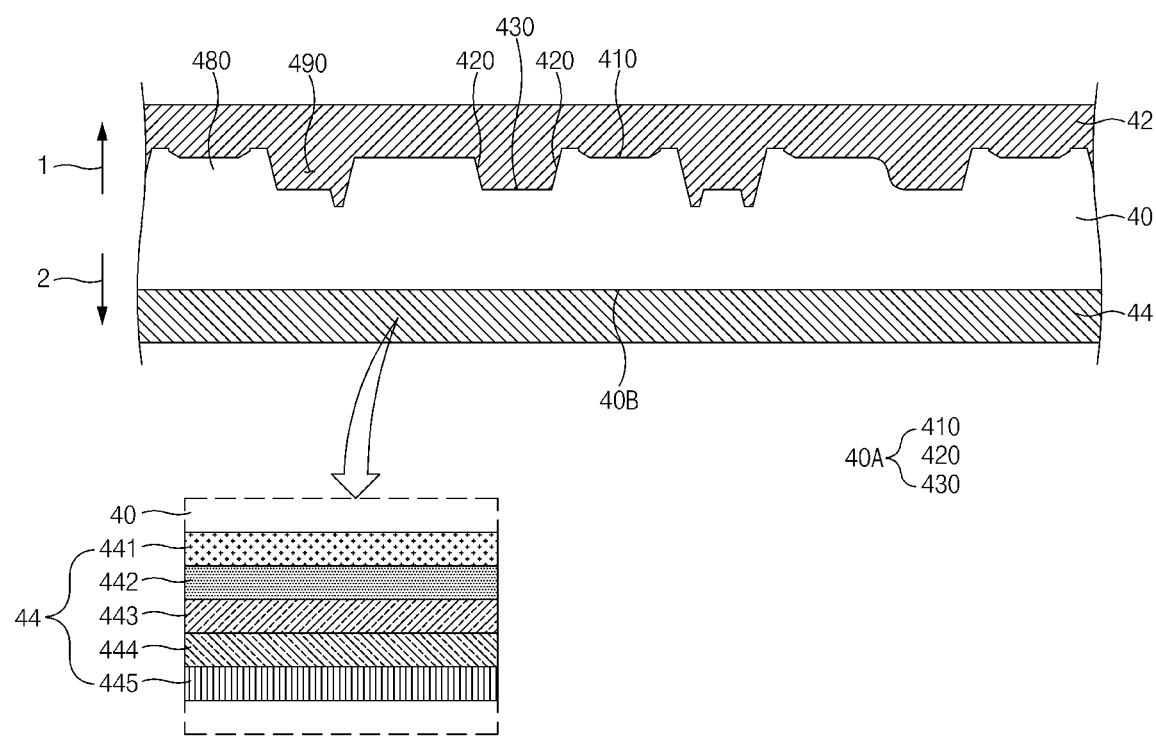
FIG. 4 is a cross-sectional view of an electronic device including a cover according to an embodiment.

FIG. 4 is a cross-sectional view of an electronic device including a cover according to an embodiment.

Referring to FIG. 4, the electronic device (e.g., the electronic device 10 of FIG. 10) according to an embodiment may include a cover 40, at least one first layer 42, and at least one second layer 44.

In an embodiment, the cover 40 may at least partially constitute the housing (e.g., the foldable housing 200 of FIG. 1) of the electronic device. For example, the cover 40 may correspond to the first rear cover 280 and/or the second rear cover 290 of FIG. 1.

In an embodiment, the cover 40 may include a front surface 40A and a rear surface 40B. In an embodiment, the front surface 40A of the cover 40 may at least partially define one surface (e.g., the rear surface of the electronic device 10 of FIG. 1) of the electronic device or may be viewed through the one surface of the electronic device. In an embodiment, the rear surface 40B of the cover 40 may face an opposite direction to the front surface 40A. For example, the front surface 40A of the cover 40 may face an outside of the electronic device, and the rear surface 40B may face an interior of the electronic device. As another example, the front surface 40A of the cover 40 may face a first direction 1, and the rear surface 40B may face a second direction 2 that is an opposite direction to the first direction 1.

In an embodiment, the cover 40 may include an embossed part 480 (or an embossed portion 480) and an engraved part 490 (or an engraved portion 490) formed on the front surface 40A. In an embodiment, the embossed part 480 may protrude in a direction (e.g., the first direction 1) that faces the front surface 40A from the rear surface 40B, and the engraved part 490 may be recessed in a direction (e.g., the second direction 2) that faces the rear surface 40B from the front surface 40A. In an embodiment, the numbers of the embossed parts 480 and the engraved parts 490 may be at least one, and the embossed parts 480 and the engraved parts 490 may be arranged (or formed) such that at least a partial area of the front surface 40A has a specific pattern (e.g., a stripe pattern or a dot pattern). Examples of the patterns formed on the front surface 40A of the cover will be described with reference to FIG. 7.

In an embodiment, the front surface 40A of the cover 40 may include an upper surface 410, an inclined surface 420, and a lower surface 430. In an embodiment, the inclined surface 420 may extend from a periphery of the upper surface 410 to a periphery of the lower surface 430 toward the rear surface 40B. In an embodiment, the embossed part 480 may be defined by the upper surface 410 and the inclined surface 420, and the engraved part 490 may be defined by the inclined surface 420 and the lower surface 430.

In an embodiment, the cover 40 may include at least one of glass, acryl, polyethylene, polyethylene terephthalate, and/or polycarbonate.

In an embodiment, the cover 40 may be substantially transparent. For example, the cover 40 may have a light transmittivity of about 80% or more, but the disclosure is not limited thereto.

In an embodiment, at least one first layer 42 may be disposed on the front surface 40A of the cover 40. In an embodiment, the at least one first layer 42, for example, may include a strength reinforcing coating (or film) and/or an anti-fingerprint (AF) coating. In an embodiment, the strength reinforcing coating may be disposed to reinforce a strength of the cover 40. In an embodiment, the AF coating may be disposed on the front surface 40A of the cover 40 or on the strength reinforcing coating layer to prevent contamination of the cover 40. However, the disclosure is not limited by the above-described example.

In an embodiment, the at least one second layer 44 may be disposed on the rear surface 40B of the cover 40. In an embodiment, the at least one second layer 44, for example, may include a metal deposition layer 443 that gives a metallic texture and a color to the cover 40, a shielding printing layer 444 formed on the metal deposition layer 443 to prevent light from being leaked from the inside to the outside, and a waterproof printing layer 445 formed on the shielding printing layer 444 to prevent moisture from being introduced into the interior of the electronic device. However, the disclosure is not limited by the above-described example. The layers may be formed on a base film layer 442 (e.g., a polyethylene terephthalate (PET) film), and the base film layer 442 may be disposed to be attached to the rear surface 40B of the cover 40 through a transparent adhesive layer 441 (e.g., an optically clear adhesive (OCA)).

Figure 5A:
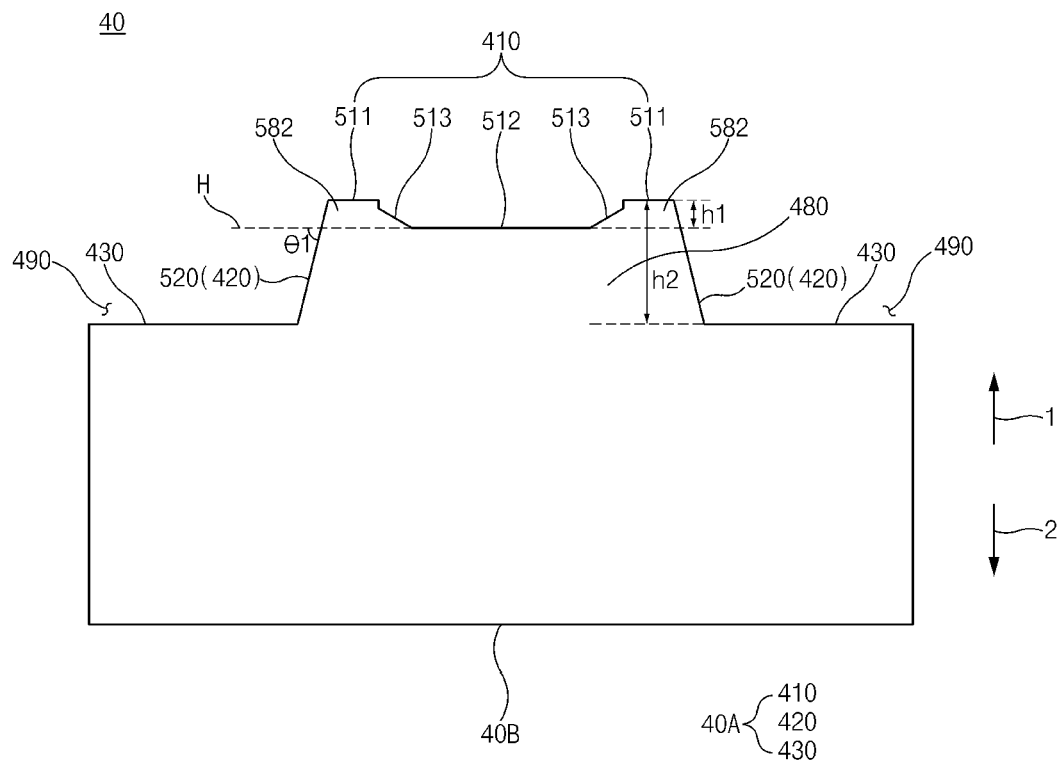
FIG. 5A is a cross-sectional view of a main part of a cover illustrating a first protruding structure according to an embodiment.
Figure 6:
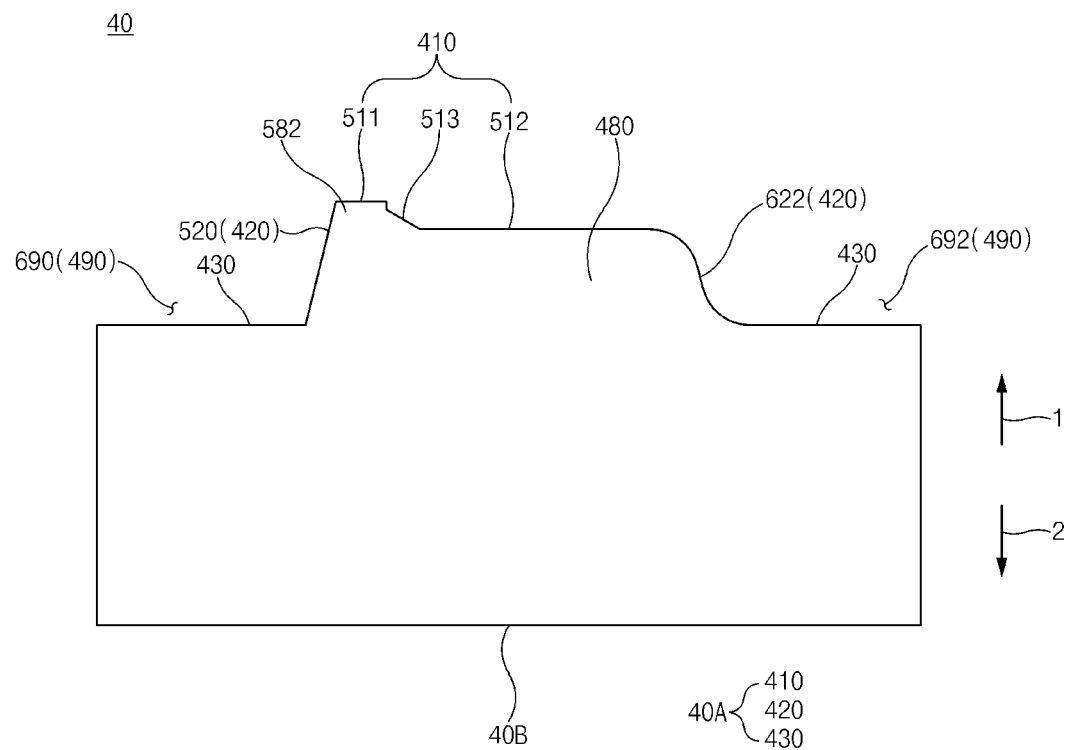
FIG. 6 is a cross-sectional view of a main part of a cover illustrating a second protruding structure according to an embodiment.

In an embodiment, the embossed part 480 of the cover 40 may include a first protruding structure illustrated in FIG. 5A and/or a second protruding structure illustrated in FIG. 6.

Figure 7:
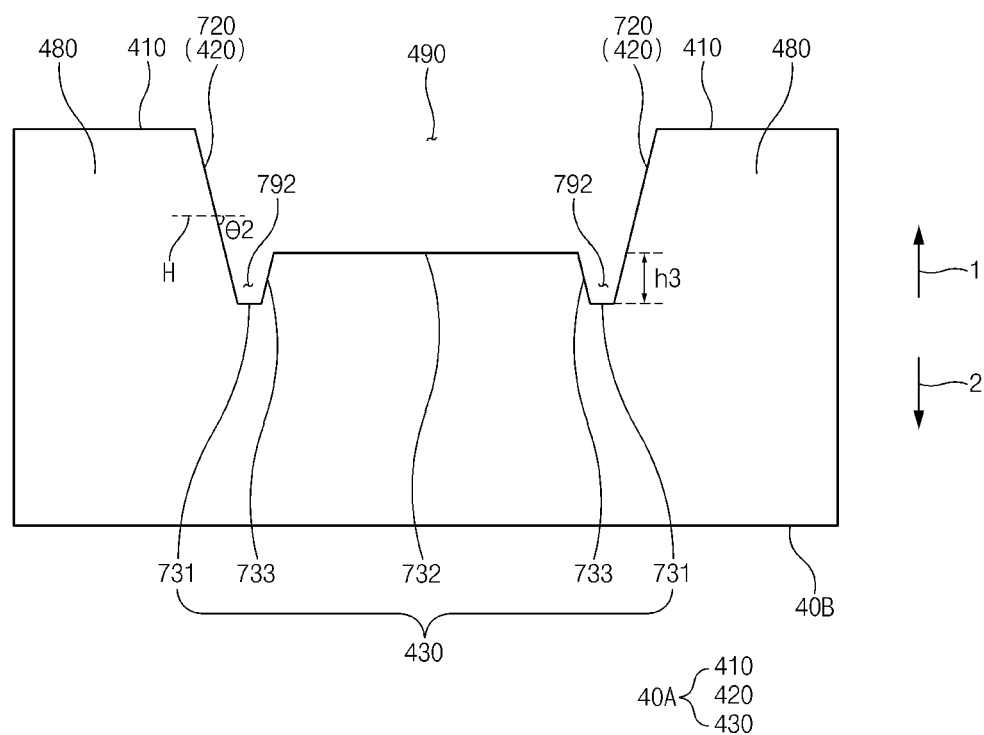
FIG. 7 is a cross-sectional view of a main part of a cover illustrating a first engraved structure according to an embodiment.
Figure 8:
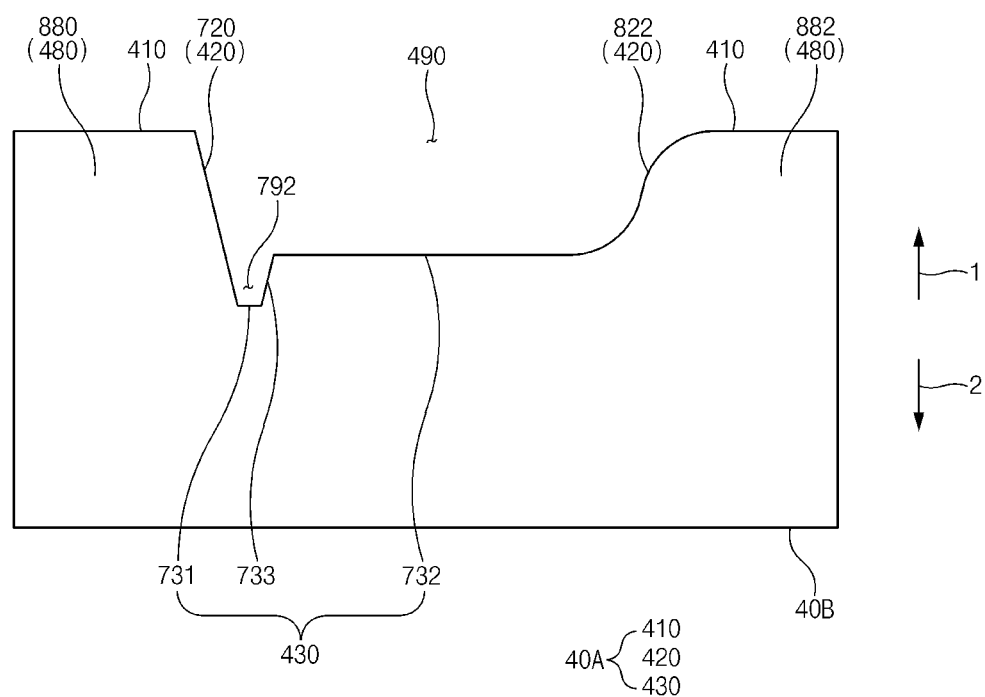
FIG. 8 is a cross-sectional view of a main part of a cover illustrating a second engraved structure according to an embodiment.

In an embodiment, the engraved part 490 of the cover 40 may include a first engraved structure illustrated in FIG. 7 and/or a second engraved structure illustrated in FIG. 8.

In an embodiment, the cover 40 may include at least one or more of the first protruding structure, the second protruding structure, the first engraved structure, and/or the second engraved structure.

In an embodiment, the at least one first layer 42 and the at least one second layer 44 may be understood as a configuration included in the cover 40 in that they are disposed on the front surface 40A and the rear surface 40B of the cover 40.

FIG. 5A is a cross-sectional view of a main part of a cover illustrating a first protruding structure according to an embodiment.

Figure 5B:
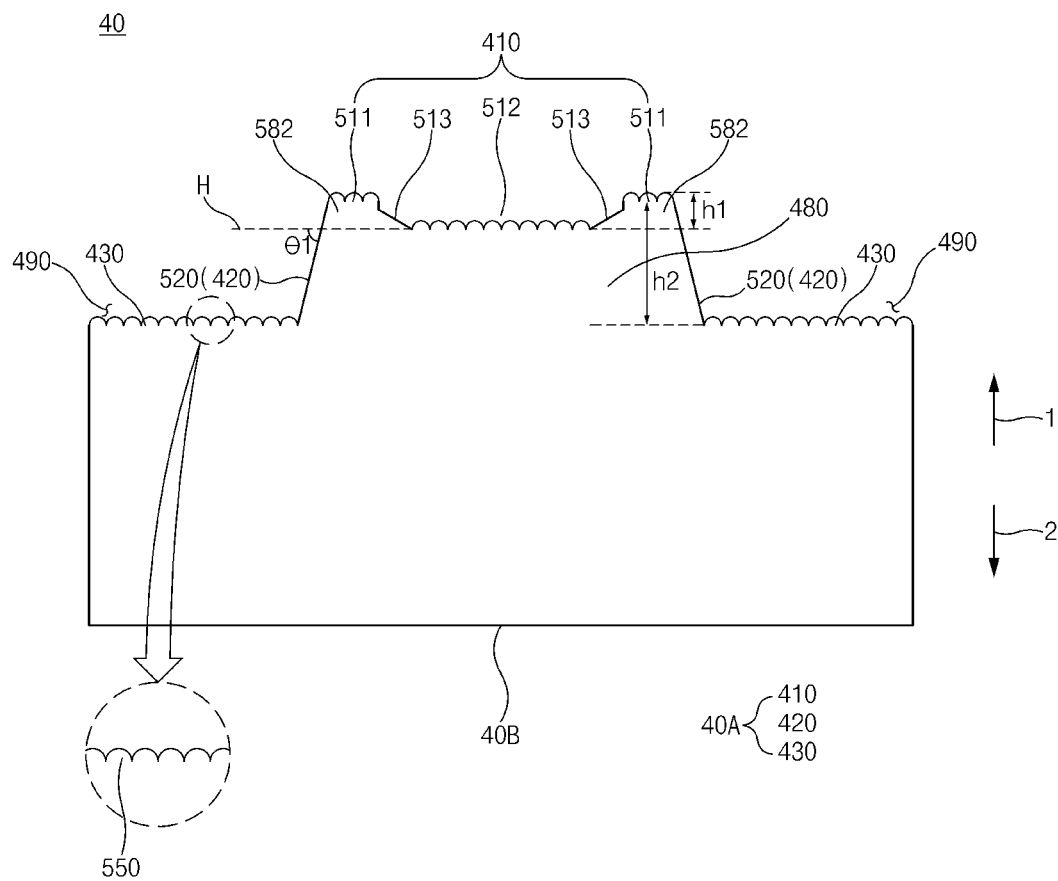
FIG. 5B is a cross-sectional view of a main part of a cover according to another embodiment.

FIG. 5B is a cross-sectional view of a main part of a cover according to another embodiment.

FIG. 6 is a cross-sectional view of a main part of a cover illustrating a second protruding structure according to an embodiment.

Referring to FIG. 5A, the cover 40 according to an embodiment may include a first protruding structure. In an embodiment, the first protruding structure of the cover 40 (or the embossed part 480 of the cover 40) may include a protrusion 582 formed by partially recessing the upper surface 410 in a direction (e.g., the second direction 2), in which the upper surface 410 faces the rear surface 40B. In an embodiment, the protrusion 582 may protrude in a direction (e.g., the first direction 1), in which the front surface 40A faces. In an embodiment, the protrusion 582 may be formed at a portion of a periphery of the upper surface 410.

In an embodiment, the upper surface 410 may include a first surface 511, a second surface 512, and a third surface 513 that extends from a periphery of the first surface 511 to a periphery of the second surface 512 toward the rear surface 40B.

In an embodiment, the inclined surface 420 may include a first inclined surface 520 that extends from the first surface 511 to the lower surface 430.

In an embodiment, the protrusion 582 may be defined by the first surface 511, the third surface 513, and the first inclined surface 520 (or a portion of the first inclined surface 520). In an embodiment, the protrusion 582 may be formed at a portion of a periphery of the upper surface 410 of the embossed part 480. In an embodiment, a height h1 of the protrusion 582 may be about 1 μm to about 5 μm, inclusive, but the disclosure is not limited thereto. In an embodiment, a height h1 of the protrusion 582 may be about 3 μm to about 5 μm, inclusive, but the disclosure is not limited thereto. In an embodiment, a ratio (h1/h2) of the height h1 of the protrusion 582 to the height h2 of the embossed part 480, for example, may be 0.05 to 0.2, but the disclosure is not limited thereto. In an embodiment, the first inclined surface 520 may extend substantially flat from the upper surface 410 to the lower surface 430 toward the rear surface 40B. For example, the first inclined surface 520 may extend substantially flat from the first surface 511 of the protrusion 582 to the lower surface 430.

In an embodiment, the first surface 511 and the second surface 512 may be substantially parallel to each other, but the disclosure is not limited thereto.

In an embodiment, the lower surface 430 may be parallel to the first surface 511 and/or the second surface 512, but the disclosure is not limited thereto.

In an embodiment, at least one of the first surface 511, the second surface 512, and/or the lower surface 430 may be substantially flat, but the disclosure is not limited thereto. For example, the lower surface 430 may be formed to be at least partially concave toward the rear surface 40B (e.g., the first engraved structure of FIG. 7 and/or the second engraved structure of FIG. 8).

In an embodiment, the first inclined surface 520 may form a first angle θ1 with a horizontal axis "H". In an embodiment, the first angle θ1 may be about 5 degrees to about 90 degrees, inclusive. In another embodiment, the first angle θ1 may be about 10 degrees to about 80 degrees, inclusive. However, because a sharpness of the pattern may increase as the first angle θ1 increases, the first angle θ1 is not limited by the above-described example, and may be selected according to a design that is to be implemented. In an embodiment, when the first surface 511 and/or the second surface 512 of the upper surface 410 has substantially the same inclination as that of the horizontal axis "H", the first angle θ1 may be understood as an angle defined by the first inclined surface 520 and the first surface 511 and/or as an angle defined by the first inclined surface 520 and the second surface 512.

In an embodiment, because the first inclined surface 520 extends substantially flat from the upper surface 410 to the lower surface 430 at the first angle θ1, the sharpness of the pattern formed by the embossed part 480 and the engraved part 490 may be enhanced, and the user may recognize a contrast of the embossed part 480 and the engraved part 490 more clearly.

In an embodiment, the pattern of the cover 40, which is formed by the embossed part 480 and the engraved part 490, may be formed by applying the cover 40 to a mold and then applying heat and pressure to the mold. The mold may have a shape corresponding to the pattern of the cover 40. For example, the mold may include a recess corresponding to the protrusion 582 of the cover 40. After the pattern is formed, a polishing process may be performed on the front surface 40A and the rear surface 40B of the cover 40 to eliminate any surface defects of the cover 40 that may be present due to the applied heat and pressure. The polishing process may include mechanical polishing and/or chemical polishing processes. After the polishing process, a thermal forming process of bending the cover 40 according to a final shape may be performed, and similarly, a polishing for eliminating any remaining surface defects may be re-performed. Due to the above-described polishing process, portions of the peripheries of the embossed part 480 and the engraved part 490 of the cover 40 may be excessively polished, whereby an inclination of the inclined surface 420 fails to be maintained and thus the sharpness of the pattern may be lowered. In an embodiment, the cover 40 includes the protrusion 582, and thus may prevent the sharpness from being lowered due to the above-described excessive polishing phenomenon. In an embodiment, because the cover 40 includes the protrusion 582, the inclination of the inclined surface 420 (e.g., the first inclined surface 520) may be maintained even when the polishing process is performed.

In another embodiment, at least a portion of the upper surface 410 and/or the lower surface 430 of the cover 40 may include a convexo-concave surface including a plurality of protrusions distinguished from the protrusion 582. For example, referring to FIG. 5B, the first surface 511 of the upper surface 410, the second surface 512 of the upper surface 410, and the lower surface 430 may at least partially include a convexo-concave surface including a plurality of protrusions 550. In an embodiment, the plurality of protrusions 550 may have a fine size of several nanometers to several hundred nanometers. In an embodiment, through the convexo-concave surface including the plurality of protrusions 550, a visual effect such as haze may be implemented.

In another embodiment, unlike the first protruding structure illustrated in FIG. 5A, the cover 40 may include a second protruding structure, in which the protrusion is formed only at a portion of the periphery of the upper surface 410 of the embossed part 480. For example, referring to FIG. 6, the protrusion 582 of the second protruding structure may be formed only at a portion of the periphery of the upper surface 410, which is adjacent to a first engraved part 690, and may not be formed at a portion of the periphery of the upper surface 410, which is adjacent to a second engraved part 692. In this case, the upper surface 410 of the embossed part 480 may include the first surface 511, the third surface 513 that extends from the first surface 511 toward the rear surface 40B, and the second surface 512 that extends from the third surface 513 to a second inclined surface 622. The inclined surface 420 may include the first inclined surface 520 that extends from a periphery of the first surface 511 to a first section of the periphery of the lower surface 430, and the second inclined surface 622 that extends from a periphery of the second surface 512 to a second section of the periphery of the lower surface 430.

In an embodiment, the description made with reference to FIG. 5B may be applied to also correspond to the embodiment of FIG. 6. For example, unlike the illustration of FIG. 6, at least a portion of the first surface 511 of the upper surface 410, the second surface 512, and/or the lower surface 430 may include a convexo-concave surface including a plurality of protrusions (e.g., the plurality of protrusions 550 of FIG. 5B) distinguished from the protrusion 582.

In an embodiment, the first inclined surface 520 may extend substantially flat from the protrusion 582 to the first section of the periphery of the lower surface 430. In an embodiment, unlike the first inclined surface 520, the second inclined surface 622 may extend from the periphery of the upper surface 410 to the second section of the periphery of the lower surface 430 not to be flat. For example, a cross-section of the second inclined surface 622 may include a curved surface. As another example, a cross-section of the second inclined surface 622 may extend in a shape that is similar to a "S" shape. However, the disclosure is not limited thereto, and for example, when the engraved part 490 including the second inclined surface 622 includes a recess 792 like the first engraved part or the second engraved part, which will be described below, the second inclined surface 622 may be substantially flat.

As illustrated in FIG. 6, a sharpness of a portion, at which the protrusion 582 is formed, may be higher than a sharpness of a portion, at which the protrusion 582 is not present. For example, due to a difference between the first inclined surface 520 and the second inclined surface 622, the user may recognize a border between the embossed part 480 and the first engraved part 690 more clearly than a border between the embossed part 480 and the second engraved part 692. In an embodiment, the cover 40 may include a first pattern formed by the embossed part 480 and the first engraved part 690 with the protrusion 582 interposed therebetween, and a second pattern formed by the embossed part 480 and the second engraved part 692 with no protrusion 582. The pattern, in which the first pattern and the second pattern having different sharpness as described above are combined, may provide a new aesthetic feeling to the user.

The protrusion 582 may be understood as being at least partially formed at a portion of the periphery of the upper surface 410 in that the protrusion 582 may be formed all of the portions of the periphery of the upper surface 410 as in the embodiment illustrated in FIG. 5A and the protrusion 582 may be formed only at a portion of the periphery of the upper surface 410 as in the embodiment illustrated in FIG. 6.

Furthermore, although it has been described with reference to FIG. 6 that the protrusion 582 is formed at all the portions of the periphery of the embossed part 480, which are adjacent to the first engraved part 690, a single or a plurality of protrusions 582 may be formed along a portion of the periphery of the embossed part 480, which is adjacent to the first engraved part 690 in another embodiment. That is, although not illustrated, when the cover 40 is viewed from the top perspective (e.g., when viewed in the second direction 2), a single protrusion 582 may be formed at least at a portion of the periphery of the embossed part 480, which is adjacent to the first engraved part 690, or a plurality of protrusions 582 may be formed to be spaced apart from each other. In this aspect, the cover 40 (or the embossed part 480) according to an embodiment may be understood as including at least one protrusion.

FIG. 7 is a cross-sectional view of a main part of a cover illustrating a first engraved structure according to an embodiment.

FIG. 8 is a cross-sectional view of a main part of a cover illustrating a second engraved structure according to an embodiment.

Referring to FIG. 7, the cover 40 according to an embodiment may include a first engraved structure. In an embodiment, the first engraved structure of the cover 40 (or the engraved part 490 of the cover 40) may include the recess 792 formed by partially recessing the lower surface 430 in a direction, in which the lower surface 430 faces the rear surface 40B. In an embodiment, the recess 792 may be formed at a portion of a periphery of the lower surface 430.

In an embodiment, the lower surface 430 may include a first surface 731, a second surface 732, and a third surface 733 that extends from a periphery of the first surface 731 to a periphery of the second surface 732 in a direction that becomes farther away from the rear surface 40B.

In an embodiment, the inclined surface 420 may include a third inclined surface 720 that extends from the first surface 731 to the upper surface 410.

In an embodiment, the recess 792 may be defined by the first surface 731, the third surface 733, and the third inclined surface 720 (or a portion of the third inclined surface 720). In an embodiment, the recess 792 may be formed at a portion of a periphery of the lower surface 430 of the engraved part 490. The portion of the periphery of the lower surface 430 may be adjacent to the embossed part 480. In an embodiment, a depth h3 of the recess 792 may be about 1 µm to about 5 µm, inclusive, but the disclosure is not limited thereto. In an embodiment, the depth h3 of the recess 792 may be substantially the same as the height of the protrusion 582 of FIG. 5A, but the disclosure is not limited thereto.

In an embodiment, the third inclined surface 720 may extend from the upper surface 410 to the lower surface 430 toward the rear surface 40B to be flat. For example, the third inclined surface 720 may extend substantially flat from the upper surface 410 to the first surface 731 of the recess 792.

In an embodiment, the first surface 731 and the second surface 732 of the lower surface 430 may be substantially parallel to each other, but the disclosure is not limited thereto.

In an embodiment, the upper surface 410 may be parallel to the first surface 731 and/or the second surface 732 of the lower surface 430, but the disclosure is not limited thereto.

In an embodiment, at least one of the first surface 731 and the second surface 732 of the lower surface 430, and the upper surface 410 may be substantially flat, but the disclosure is not limited thereto. For example, as illustrated in FIG. 5B, at least one of the first surface 731 of the lower surface 430, the second surface 732 of the lower surface 430, and/or the upper surface 410 may include a convexo-concave surface including a plurality of protrusions. As another example, the upper surface 410 may be formed to be partially recessed toward the rear surface 40B (e.g., the first protruding structure of FIG. 5A and/or the second protruding structure of FIG. 6).

In an embodiment, the third inclined surface 720 may form a second angle θ2 with the horizontal axis "H". In an embodiment, the second angle θ2 may be about 5 degrees to about 90 degrees, inclusive. In another embodiment, the second angle θ2 may be about 10 degrees to about 80 degrees, inclusive. In an embodiment, the second angle θ2 may be substantially the same as the first angle θ1 that is the angle of the first inclined surface (520 of FIG. 5) with respect to the horizontal axis "H", but the disclosure is not limited thereto. In an embodiment, because the sharpness of the pattern varies according to the second angle θ2, the second angle θ2 may be selected according to a design that is to be implemented. In an embodiment, when the first surface 731 and/or the second surface 732 of the lower surface 430 has substantially the same inclination as that of the horizontal axis "H", the second angle θ2 may be understood as an angle defined by the third inclined surface 720 and the first surface 731 and/or an angle defined by the third inclined surface 720 and the second surface 732.

In an embodiment, because the third inclined surface 720 extends substantially flat at the second angle θ2, the sharpness of the pattern formed by the embossed part 480 and the engraved part 490 may be enhanced.

Similarly to the description made with reference to the protrusion 582 of FIG. 5A, the recess 792 formed in the engraved part 490 may prevent the inclination of the inclined surface 420 from failing to be maintained due to an excessive polishing phenomenon whereby the sharpness is lowered. In an embodiment, the cover 40 including the recess 792 (or the first engraved structure) may maintain the inclination of the inclined surface 420 (e.g., the third inclined surface 720) even though a polishing process is performed.

In another embodiment, unlike the first engraved structure illustrated in FIG. 7, the recess 792 of the cover 40 may include a second engraved structure, in which the engraved part 490 is formed only at a portion of the periphery of the lower surface 430. For example, referring to FIG. 8, the recess 792 of the second engraved structure may be formed only at a portion of the periphery of the lower surface 430, which is adjacent to a first embossed part 880, and may not be formed at a portion of the periphery of the lower surface 430, which is adjacent to a second embossed part 882. In this case, the lower surface 430 of the engraved part 490 may include the first surface 731, the second surface 732, and the third surface 733 that extends from a periphery of the second surface 732 to a periphery of the first surface 731 toward the rear surface 40B. In an embodiment, the inclined surface 420 may include the third inclined surface 720 that extends from a periphery of the first surface 731 to a third periphery of the upper surface 410, and a fourth inclined surface 822 that extends from a periphery of the second surface 732 to a fourth periphery of the upper surface 410.

In an embodiment, the description made with reference to FIG. 5B may be applied to also correspond to the embodiment of FIG. 8. For example, unlike the illustration of FIG. 8, at least a portion of the first surface 731 of the lower surface 430, the second surface 732, and/or the upper surface 410 may include a convexo-concave surface including a plurality of protrusions (e.g., the plurality of protrusions 550 of FIG. 5B).

In an embodiment, the third inclined surface 720 may extend substantially flat from the recess 792 to the third periphery of the upper surface 410. In an embodiment, unlike the third inclined surface 720, the fourth inclined surface 822 may extend from the periphery of the lower surface 430 to the fourth periphery of the upper surface 410 not to be flat. For example, a cross-section of the fourth inclined surface 822 may include a curved surface. As another example, a cross-section of the fourth inclined surface 822 may extend in a shape that is similar to a "S" shape. However, the disclosure is not limited thereto, and for example, when the embossed part 480 including the fourth inclined surface 822 includes the protrusion 582 like the first protruding structure or the second protruding structure, the fourth inclined surface 822 may be substantially flat.

As illustrated in FIG. 8, a sharpness of a portion, at which the recess 792 is formed, may be higher than a sharpness of a portion, at which the recess 792 is not present. For example, the user may recognize a border between the engraved part 490 and the first embossed part 880 more clearly than a border between the engraved part 490 and the second embossed part 882. In an embodiment, the cover 40 may include a third pattern formed by the engraved part 490 and the first embossed part 880 with the recess 792 interposed therebetween, and a fourth pattern formed by the engraved part 490 and the second embossed part 882 with no recess 792. The pattern, in which the third pattern and the fourth pattern having different sharpness are combined, may provide a new aesthetic feeling to the user.

The recess 792 may be understood as being at least partially formed at a portion of the periphery of the lower surface 430 in that the recess 792 may be formed all of the portions of the periphery of the lower surface 430 as in the embodiment illustrated in FIG. 7 and the recess 792 may be formed only at a portion of the periphery of the lower surface 430 as in the embodiment illustrated in FIG. 8.

Furthermore, although it has been described with reference to FIG. 8 that the recess 792 is formed at all the portions of the periphery of the engraved part 490, which are adjacent to the first embossed part 880, a single or a plurality of recesses 792 may be formed along a portion of the periphery of the engraved part 490, which is adjacent to the first embossed part 880 in another embodiment. That is, although not illustrated, when the cover 40 is viewed from the top perspective (e.g., when viewed in the second direction 2), the single recess 792 may be formed at least at a portion of the periphery of the engraved part 490, which is adjacent to the first embossed part 880, or a plurality of recesses 792 may be formed to be spaced apart from each other. In this aspect, the cover 40 (or the engraved part 490) according to an embodiment may be understood as including at least one recess.

Figure 9:
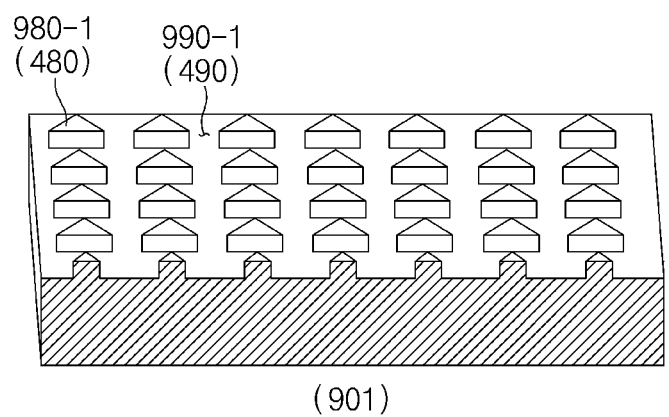
FIG. 9 is a view illustrating examples of patterns of a cover according to an embodiment.
Figure 9:
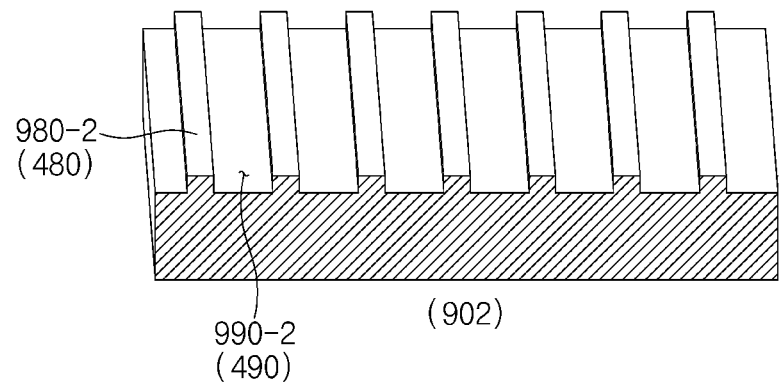

FIG. 9 is a view illustrating examples of patterns of a cover according to an embodiment.

Referring to FIG. 9, the cover (e.g., the cover 40 of FIG. 4) according to an embodiment may have a specific pattern formed by the embossed part 480 and the engraved part 490.

For example, as in reference numeral 901 of FIG. 9, the cover may include a dot pattern formed by an embossed part 980-1 and an engraved part 990-1. In an embodiment, when the cover is viewed from the top perspective (or the front surface (e.g., the front surface 40A of FIG. 4) of the cover is viewed), the shape of the embossed part 480 may be triangular, but the disclosure is not limited thereto. For example, the shape of the embossed part 480 may include at least one of a circular shape, a rectangular shape, and/or a polygonal shape.

As another example, as in reference numeral 902 of FIG. 9, the cover may include a stripe pattern formed by an embossed part 980-2 and an engraved part 990-2.

However, the pattern of the cover is not limited by the above-described example, and various design changes may be possible. For example, the cover may include a pattern, in which the embossed part 480 and the engraved part 490 of the illustrated example are formed inversely. As another example, the cover may include a lattice pattern. As another example, the cover may include a pattern, in which at least two of the dot pattern, the stripe pattern, and/or the lattice pattern, which have been described above, are combined.

Although the protrusion (e.g., the protrusion 582 of FIGS. 5A and 6) of the embossed part 480 and the recess (e.g., the recess 792 of FIGS. 7 and 8) of the engraved part 490 are not illustrated in FIG. 9 for convenience of description, the embossed part 480 may include a first protruding structure and/or a second protruding structure, and the engraved part 490 may include a first engraved structure and/or a second engraved structure. In an embodiment, a single or a plurality of protrusions formed in the embossed part 480 may be formed at least at a portion (e.g., a portion of the periphery of the upper surface 410 of FIG. 5A) of the periphery of the embossed part 480. In an embodiment, a single or a plurality of recesses formed in the engraved part 490 may be formed at least at a portion (e.g., a portion of the periphery of the lower surface 430 of FIG. 7) of the periphery of the engraved part 490.

An electronic device (e.g., the electronic device 10 of FIG. 1) according to the above-described various embodiments includes a cover (e.g., the cover 40 of FIG. 4) having a front surface (e.g., the front surface 40A of FIG. 4) defining one surface (e.g., the rear surface of the electronic device 10 of FIG. 1) of the electronic device and a rear surface (e.g., the rear surface 40B of FIG. 4) that is an opposite surface to the front surface, the front surface of the cover includes an upper surface (e.g., the upper surface 410 of FIG. 4), a lower surface (e.g., the lower surface 430 of FIG. 4), and an inclined surface (e.g., the inclined surface 420 of FIG. 4) extending from a periphery of the upper surface to a periphery of the lower surface toward the rear surface, the cover includes at least one protrusion (e.g., the protrusion 582 of FIG. 5A) at least partially formed at the periphery of the upper surface by partially recessing the upper surface in a direction that faces the rear surface, the inclined surface includes a first inclined surface (e.g., the first inclined surface 520 of FIG. 5A) extending substantially flat from the at least one protrusion to a first section of the periphery of the lower surface.

In an embodiment, the upper surface may include a first surface (e.g., the first surface 511 of FIG. 5A) extending from the first inclined surface, a second surface (e.g., the second surface 512 of FIG. 5A), and a third surface (e.g., the third surface 513 of FIG. 3A) extending from a periphery of the first surface to a periphery of the second surface toward the rear surface, and the at least one protrusion may be defined by the first inclined surface, the first surface, and the third surface.

In an embodiment, the inclined surface may include a second inclined surface (e.g., the second inclined surface 622 of FIG. 6) extending from the periphery of the second surface (e.g., the second surface 512 of FIG. 6) to a second section of the periphery of the lower surface, and the second inclined surface may include a curved surface.

In an embodiment, at least one of the first surface, the second surface, or the lower surface may be substantially flat.

In an embodiment, at least one of the first surface, the second surface, or the lower surface at least partially may include a convexo-concave surface having a plurality of protrusions (e.g., the plurality of protrusions 550 of FIG. 5B) distinguished from the at least one protrusion.

In an embodiment, the first surface and the second surface may be substantially parallel to each other.

In an embodiment, the cover may include at least one embossed part (e.g., the embossed part 480 of FIG. 4) defined by the upper surface and the inclined surface, and at least one engraved part (e.g., the engraved part 490 of FIG. 4) defined by the lower surface and the inclined surface, and the front surface of the cover may have a specific pattern formed by the at least one embossed part and the at least one engraved part.

In an embodiment, the specific pattern may be a stripe pattern (e.g., the stripe pattern like reference numeral 902 of FIG. 9) or a dot pattern (e.g., the dot pattern like reference numeral 901 of FIG. 9).

In an embodiment, when the front surface of the cover is viewed, a shape of the upper surface of the at least one embossed part may have at least one of a circular shape, a triangular shape, or a rectangular shape.

In an embodiment, the first inclined surface may form an angle of about 10 degrees to about 80 degrees, inclusive, with respect to a horizontal axis.

In an embodiment, the at least one protrusion may have a height of about 1 μm to about 5 μm, inclusive.

In an embodiment, the cover may include at least one of glass, acryl, polyethylene, polyethylene terephthalate, or polycarbonate.

In an embodiment, the cover may include at least one recess (e.g., the recess 792 of FIG. 7) at least partially formed at a portion of the periphery of the lower surface by partially recessing the lower surface in a direction that faces the rear surface, the inclined surface may include a third inclined surface (e.g., the third surface 720 of FIG. 7) extending substantially flat from the at least one recess to a third periphery of the upper surface.

In an embodiment, the cover may include at least one embossed part (e.g., the embossed part 480 of FIG. 6) defined by the upper surface and the inclined surface, and at least one engraved part (e.g., the engraved part 490 of FIG. 6) defined by the lower surface and the inclined surface, and the at least one engraved part may include a first engraved part (e.g., the first engraved part 690 of FIG. 6) and a second engraved part (e.g., the second engraved part 692 of FIG. 6), and the at least one protrusion may be formed at a portion of the periphery of the upper surface, which is adjacent to the first engraved part, and may not be formed at a portion of the periphery of the upper surface, which is adjacent to the second engraved part.

In an embodiment, the cover may include at least one embossed part (e.g., the embossed part 480 of FIG. 8) defined by the upper surface and the inclined surface, at least one engraved part (e.g., the engraved part 490 of FIG. 8) defined by the lower surface and the inclined surface, the at least one engraved part may include a first embossed part (e.g., the first embossed part 880 of FIG. 8) and a second engraved part (e.g., the second embossed part 882 of FIG. 8), and the at least one recess may be formed at a portion of the periphery of the lower surface, which is adjacent to the first embossed part, and may not be formed at a portion of the periphery of the lower surface, which is adjacent to the second embossed part.

In an embodiment, the cover may be substantially transparent.

In an embodiment, the cover includes at least one first layer (e.g., the at least one first layer 42 of FIG. 4) disposed on the front surface and at least one second layer (e.g., the at least one second layer 44 of FIG. 4) disposed on the rear surface, the at least one first layer may include at least one of a strength reinforcing coating or an anti-fingerprint (AF) coating, and the at least one second layer includes at least one of a metal deposition layer (e.g., the metal deposition layer 443 of FIG. 4), a shielding printing layer (e.g., the shielding printing layer 444 of FIG. 4), or a waterproof printing layer (e.g., the waterproof printing layer 445 of FIG. 4).

The electronic device (e.g., the electronic device 10 of FIG. 1) according to the above-described embodiment includes a cover (e.g., the cover 40 of FIG. 4) having a front surface (e.g., the front surface 40A of FIG. 4) defining one surface (e.g., the rear surface of the electronic device 10 of FIG. 1) of the electronic device and a rear surface (e.g., the rear surface 40B of FIG. 4) that is an opposite surface to the front surface, the front surface of the cover includes an upper surface (e.g., the upper surface 410 of FIG. 4), a lower surface (e.g., the lower surface 430 of FIG. 4), and an inclined surface (e.g., the inclined surface 420 of FIG. 4) extending from a periphery of the upper surface to a periphery of the lower surface toward the rear surface, the cover includes at least one recess (e.g., the recess 792 of FIG. 7) at least partially formed at a portion of the periphery of the lower surface by partially recessing the lower surface in a direction that faces the rear surface, the inclined surface includes a first inclined surface (e.g., the first surface 720 of FIG. 7) extending from the at least one recess to a first section of the periphery of the upper surface, and the first inclined surface extends to be substantially flat.

In an embodiment, the lower surface may include a first surface (e.g., the first surface 731 of FIG. 7) extending from the first inclined surface, a second surface (e.g., the second surface 732 of FIG. 7), and a third surface (e.g., the third surface 733 of FIG. 7) extending from a periphery of the first surface to a periphery of the second surface in a direction that becomes farther away from the rear surface, and the at least one recess may be defined by the first inclined surface, the first surface, and the third surface.

In an embodiment, the inclined surface may include a second inclined surface (e.g., the fourth inclined surface 822 of FIG. 8) extending from the periphery of the second surface to a second section of the periphery of the upper surface, and the second inclined surface may include a curved surface.

Figure 10:
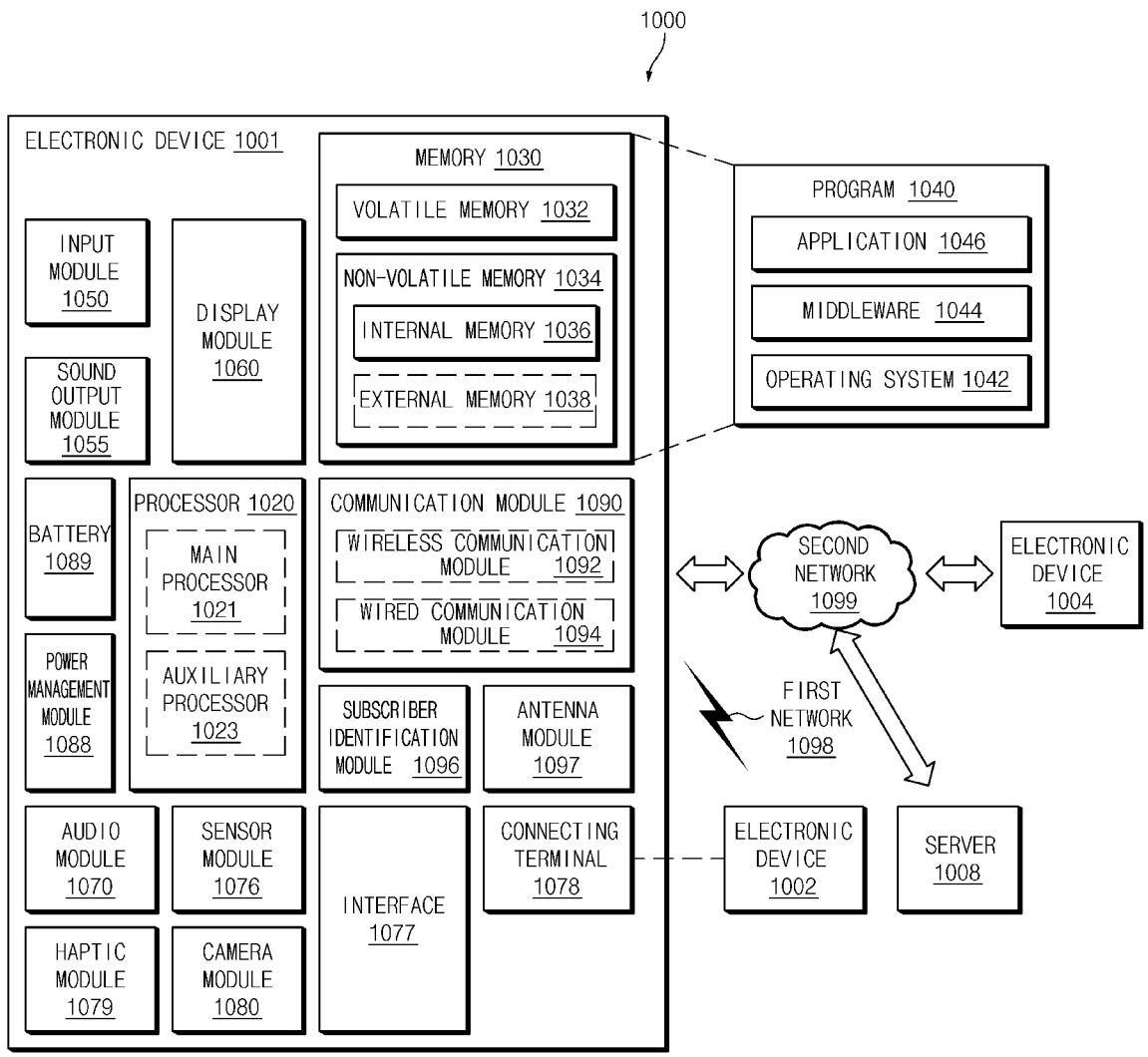
FIG. 10 is a block diagram of an electronic device in a network environment according to various embodiments.

FIG. 10 is a block diagram illustrating an electronic device 1001 in a network environment 1000 according to various embodiments.

Referring to FIG. 10, the electronic device 1001 in the network environment 1000 may communicate with an electronic device 1002 via a first network 1098 (e.g., a short-range wireless communication network), or at least one of an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input module 1050, a sound output module 1055, a display module 1060, an audio module 1070, a sensor module 1076, an interface 1077, a connecting terminal 1078, a haptic module 1079, a camera module 1080, a power management module 1088, a battery 1089, a communication module 1090, a subscriber identification module (SIM) 1096, or an antenna module 1097. In some embodiments, at least one of the components (e.g., the connecting terminal 1078) may be omitted from the electronic device 1001, or one or more other components may be added in the electronic device 1001. In some embodiments, some of the components (e.g., the sensor module 1076, the camera module 1080, or the antenna module 1097) may be implemented as a single component (e.g., the display module 1060).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may store a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and/or an auxiliary processor 1023 (e.g., a graphics processing unit (GPU), a neural processing unit (NPU), an image signal processor (ISP), a sensor hub processor, or a communication processor (CP)) that is operable independently from, or in conjunction with, the main processor 1021. For example, when the electronic device 1001 includes the main processor 1021 and the auxiliary processor 1023, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display module 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023. According to an embodiment, the auxiliary processor 1023 (e.g., the neural processing unit) may include a hardware structure specified for artificial intelligence model processing. An artificial intelligence model may be generated by machine learning. Such learning may be performed, e.g., by the electronic device 1001 where the artificial intelligence is performed or via a separate server (e.g., the server 1008). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input module 1050 may receive a command or data to be used by another component (e.g., the processor 1020) of the electronic device 1001, from the outside (e.g., a user) of the electronic device 1001. The input module 1050 may include, for example, a microphone, a mouse, a keyboard, a key (e.g., a button), or a digital pen (e.g., a stylus pen).

The sound output module 1055 may output sound signals to the outside of the electronic device 1001. The sound output module 1055 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1060 may visually provide information to the outside (e.g., a user) of the electronic device 1001. The display module 1060 may include, for example, a display, a hologram device, or a projector and control circuitry to control a corresponding one of the display, hologram device, and projector. According to an embodiment, the display module 1060 may include a touch sensor adapted to detect a touch, or a pressure sensor adapted to measure the intensity of force incurred by the touch.

The audio module 1070 may convert a sound into an electrical signal and vice versa. According to an embodiment, the audio module 1070 may obtain the sound via the input module 1050, or output the sound via the sound output module 1055 or a headphone of an external electronic device (e.g., an electronic device 1002) directly (e.g., by wired connection) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., by wired connections) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, a SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module (SIM) 1096.

The wireless communication module 1092 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1092 may support a high-frequency band (e.g., the mmWave band) to achieve, e.g., a high data transmission rate. The wireless communication module 1092 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1092 may support various requirements specified in the electronic device 1001, an external electronic device (e.g., the electronic device 1004), or a network system (e.g., the second network 1099). According to an embodiment, the wireless communication module 1092 may support a peak data rate (e.g., 20 Gbps or more) for implementing eMBB, loss coverage (e.g., 1064 dB or less) for implementing mMTC, or U-plane latency (e.g., 0.5 ms or less for each of downlink (DL) and uplink (UL), or a round trip of 10 ms or less) for implementing URLLC.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., a printed circuit board (PCB)). According to an embodiment, the antenna module 1097 may include a plurality of antennas (e.g., array antennas). In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

According to various embodiments, the antenna module 1097 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 or 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, mobile edge computing (MEC), or client-server computing technology may be used, for example. The electronic device 1001 may provide ultra low-latency services using, e.g., distributed computing or mobile edge computing. In another embodiment, the external electronic device 1004 may include an internet-of-things (IoT) device. The server 1008 may be an intelligent server using machine learning and/or a neural network. According to an embodiment, the external electronic device 1004 or the server 1008 may be included in the second network 1099. The electronic device 1001 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a cover having a front surface defining one surface of the electronic device and a rear surface that is an opposite surface to the front surface,
wherein the front surface includes:
an upper surface;
a lower surface; and
an inclined surface extending from a periphery of the upper surface to a periphery of the lower surface toward the rear surface,
wherein the cover includes at least one protrusion at least partially formed at the periphery of the upper surface by partially recessing the upper surface in a direction that faces the rear surface,
the inclined surface including a first inclined surface extending substantially flat from the at least one protrusion to a first section of the periphery of the lower surface, wherein the cover includes:
at least one embossed part defined by the upper surface and the inclined surface; and
at least one engraved part defined by the lower surface and the inclined surface, and
wherein the at least one engraved part includes a first engraved part and a second engraved part, and
wherein the at least one protrusion is formed at a portion of the periphery of the upper surface, which is adjacent to the first engraved part, and is not formed at a portion of the periphery of the upper surface, which is adjacent to the second engraved part.

2. The electronic device of claim 1, wherein the third surface is inclined from the second surface toward the first surface and extends from a periphery of the first surface to a periphery of the second surface toward the rear surface.

3. The electronic device of claim 1, wherein the inclined surface includes a second inclined surface extending from the periphery of the second surface to a second section of the periphery of the lower surface, and wherein the second inclined surface includes a curved surface.

4. The electronic device of claim 1, wherein at least one of the first surface, the second surface, or the lower surface is substantially flat.

5. The electronic device of claim 1, wherein at least one of the first surface, the second surface, or the lower surface at least partially includes a convexo-concave surface having a plurality of protrusions distinguished from the at least one protrusion.

6. The electronic device of claim 1, wherein the first surface and the second surface are substantially parallel to each other.

7. The electronic device of claim 1, wherein the front surface of the cover has a specific pattern formed by the at least one embossed part and the at least one engraved part.

8. The electronic device of claim 7, wherein the specific pattern is a stripe pattern or a dot pattern.

9. The electronic device of claim 7, wherein when the front surface of the cover is viewed, a shape of the upper surface corresponding to the at least one embossed part has at least one of a circular shape, a triangular shape, or a rectangular shape.

10. The electronic device of claim 1, wherein the first inclined surface forms an angle of 10 degrees to 80 degrees, inclusive, with respect to a horizontal axis.

11. The electronic device of claim 1, wherein the at least one protrusion has a height of 1 μm to 5 μm, inclusive.

12. The electronic device of claim 1, wherein the cover includes at least one of glass, acryl, polyethylene, polyethylene terephthalate, or polycarbonate.

13. The electronic device of claim 1, wherein the cover includes at least one recess at least partially formed at a portion of the periphery of the lower surface by partially recessing the lower surface in a direction that faces the rear surface, wherein the inclined surface includes a third inclined surface extending substantially flat from the at least one recess to a third periphery of the upper surface.

14. The electronic device of claim 1, wherein the cover is substantially transparent.

15. The electronic device of claim 1, wherein the cover includes at least one first layer disposed on the front surface and at least one second layer disposed on the rear surface, wherein the at least one first layer includes at least one of a strength reinforcing coating or an anti-fingerprint (AF) coating, and wherein the at least one second layer includes at least one of a metal deposition layer, a shielding printing layer, or a waterproof printing layer.

16. An electronic device comprising:

a cover having a front surface defining one surface of the electronic device and a rear surface that is an opposite surface to the front surface, wherein the front surface includes:

an upper surface;

a lower surface; and an inclined surface extending from a periphery of the upper surface to a periphery of the lower surface toward the rear surface, wherein the cover includes at least one protrusion at least partially formed at the periphery of the upper surface by partially recessing the upper surface in a direction that faces the rear surface, the inclined surface including a first inclined surface extending substantially flat from the at least one protrusion to a first section of the periphery of the lower surface, wherein the cover includes at least one recess at least partially formed at a portion of the periphery of the lower surface by partially recessing the lower surface in a direction that faces the rear surface, wherein the inclined surface includes a third inclined surface extending substantially flat from the at least one recess to a third periphery of the upper surface, and wherein the cover includes:

at least one embossed part defined by the upper surface and the inclined surface; and at least one engraved part defined by the lower surface and the inclined surface, and wherein the at least one engraved part includes a first engraved part and a second engraved part, and wherein the at least one recess is formed at a portion of the periphery of the lower surface, which is adjacent to the first embossed part, and is not formed at a portion of the periphery of the lower surface, which is adjacent to the second embossed part.

* * * * *